United States Patent [19]

Roedel et al.

[11] Patent Number: 5,736,426
[45] Date of Patent: Apr. 7, 1998

[54] PROCESS FOR ARRANGING PRINTED CONDUCTORS ON THE SURFACE OF SEMICONDUCTOR COMPONENTS

[75] Inventors: Carsten Roedel, Reutlingen; Juergen Scheible, Sonnenbuehl, both of Germany

[73] Assignee: Robert Bosch GmbH, Stuttgart, Germany

[21] Appl. No.: 696,291

[22] Filed: Aug. 13, 1996

[30] Foreign Application Priority Data

Aug. 23, 1995 [DE] Germany ............ 195 30 951.0

[51] Int. Cl.⁶ .................................................. H01L 21/00
[52] U.S. Cl. ................................................................ 438/6
[58] Field of Search ........................ 437/8, 180; 438/6

[56] References Cited

U.S. PATENT DOCUMENTS 4,158,072  6/1979  Bohg et al. ............................. 437/8

FOREIGN PATENT DOCUMENTS

| 0 442 491 A2 | 8/1991 | European Pat. Off. . |
| 1-114050 A | 2/1989 | Japan . |
| 4-10555 A | 1/1992 | Japan . |
| 4-167545 A | 6/1992 | Japan . |

OTHER PUBLICATIONS

Elsevier, Integration, the VLSI Journal 12 (1991), 189–210.

Primary Examiner—Brian Dutton
Attorney, Agent, or Firm—Kenyon & Kenyon

[57] ABSTRACT

In a process for arranging printed conductors on the surface of a semiconductor component, printed conductors connect wire ranges that are designed as polygons. The polygons are composed of individual edge points. With regard to each of these edge points, it is determined whether it can be connected by a printed conductor running parallel to the coordinate system or diagonally to the coordinate system. Additional edge points may also have a "not connectable" status.

8 Claims, 2 Drawing Sheets

|   | x | y | x + y | x - y |
|---|---|---|-------|-------|
| A | 0 | 4 | 4 | -4 |
| B | 4 | 8 | 12 | -4 |
| C | 8 | 6 | 14 | 2 |
| D | 10 | 2 | 12 | 8 |
| E | 6 | 0 | 6 | 6 |
| F | 0 | 0 | 0 | 0 |

PROCESS FOR ARRANGING PRINTED CONDUCTORS ON THE SURFACE OF SEMICONDUCTOR COMPONENTS

BACKGROUND INFORMATION

Processes are known for arranging printed conductors on semiconductor components, on which a rectangular coordinate system is used, where the printed conductors are arranged only parallel to the coordinate axes or at an angle of 45° to the coordinate axes. Such printed conductors then connect wire ranges designed as polygons.

SUMMARY OF THE INVENTION

The process according to the present invention has the advantage that proper connection of the printed conductor to the polygonal wire ranges is assured. This process is also very simple and is especially suitable for computerized automation.

It is especially simple to store the edge points as first and second coordinates in a coordinate system. Then by considering these coordinates it is easy to determine the edge points that can be connected at right angles. When a corner is connected, the printed conductors are lengthened inward. By adding and subtracting the coordinates, it is easy to determine the edge points that can be connected diagonally. To assure a satisfactory connection, the printed conductor is then lengthened outward when the contact is established.

DETAILED DESCRIPTION

Figure 1:
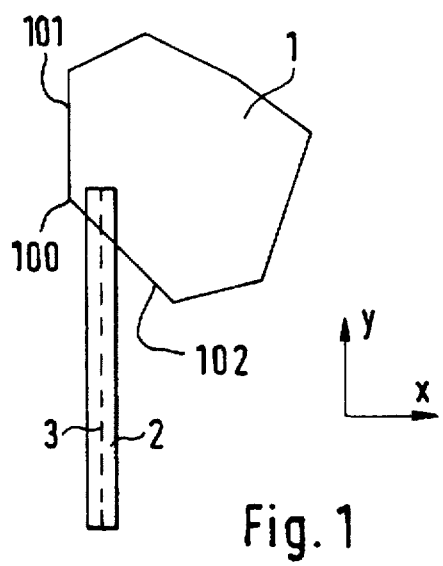
FIG. 1 illustrates a first erroneous arrangement for linking a printed conductor to a wire range.

FIG. 1 shows a wire range 1 and a printed conductor 2 arranged on the surface of a semiconductor component. Such a wire range 1 is a conducting area such as a metal layer or a highly doped polysilicon layer applied to the surface of a semiconductor component. Such wire ranges 1 can be used for contacting underlying semiconductor areas. In addition, such wire ranges can also be used for attaching bond wires for establishing a connection between the semiconductor component and other circuit components. As a rule, several of these wire ranges 1 are provided on the surface of semiconductor elements for contacting various components integrated into the semiconductor or for establishing various connections via bond wires. The individual wire ranges 1 of a semiconductor component, in particular an integrated circuit, are interconnected by several printed conductors 2. Such printed conductors 2 are usually thin metal layers or highly doped polysilicon layers applied to the surface of the semiconductor component. Numerous connections are established between wire ranges 1 by printed conductors 2. Wire ranges 1 and printed conductors 2 need not necessarily be made of the same material.

To determine where printed conductors 2 are arranged on the surface of the semiconductor element, a path 3, i.e., a thin line, is defined. Printed conductor 2 is then produced by arranging the appropriate layers for printed conductor 2 on path 3 with an appropriate width. Paths 3 are aligned with an x,y coordinate system, where paths 3 run either parallel to the x or y axis or form a 45° angle to these axes. Printed conductors 2 formed in this way are thus either normal to the coordinate system (i.e., parallel to the x or y axis) or diagonal to the coordinate system (45° angle).

Wire ranges 1 are designed with polygon edges. Such a polygon has several corner points connected by straight lines. These straight lines form the sides of the polygon. The side walls of wire ranges 1 may assume any desired angle in the x,y coordinate system. For further discussion, FIG. 1 shows a corner point 100 and the two sides 101, 102 adjacent to corner point 100.

In FIG. 1 printed conductor 2 is linked to wire range 1 in such a way that printed conductor 2 intersects side 102 of wire range 1 at an acute angle, i.e., an angle of less than 90°. Such angles pose a problem because printed conductor 2 must always maintain a certain distance from wire ranges 1. Because of the current flowing through printed conductors 2 and the potential applied to the printed conductors, an electric field develops around printed conductors 2 and can interfere with the operation of other components. The photolithographic process does not allow distances below a certain value to be produced. Therefore, printed conductors 2 must maintain a certain minimum distance from other printed circuits, other operating areas of the semiconductor component and also wire ranges 1. Only in areas where contact is desired between printed conductor 2 and wire range 1 is it permissible for these distances to be smaller.

If one side of wire range 1 forms an acute angle with printed conductor 2, the distance between printed conductor 2 and wire range 1 cannot be maintained in the area of the acute angle. Therefore, printed conductors 2 must be connected to wire ranges 1 in such a way that there are no acute angles, i.e., angles >90° Since printed conductors 2 can be provided only parallel to the coordinate axes or at an angle of 45° relative to the x,y coordinate system, only sides of the polygon that are either (approximately) parallel to the x or y axis or form an angle of (approximately) 45° with the x or y axis may be connected. However, printed conductor 2 may be connected to wire range 1 at the corner points even when the sides adjacent to the corner point are not parallel or diagonal to the coordinate system. This is illustrated in FIG. 2.

Figure 2:
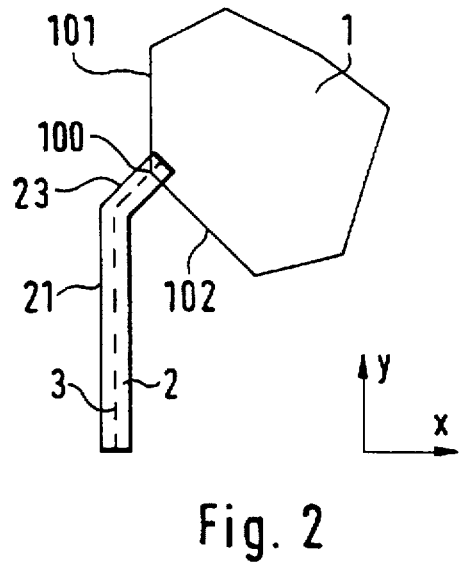
FIG. 2 shows a first proper arrangement of a printed conductor linking a wire range.

FIG. 2 shows the connection of a printed conductor 2 to a wire range 1, where the connection is not made with a side of polygonal wire range 1 but instead with a corner point 100. As this shows, corner point 100 of the polygon can be connected by a diagonal printed conductor without forming any acute angles. Segment 23 also has a given minimum length, which ensures that the distance between segment 21 and side 102 will be sufficiently large.

Figure 3:
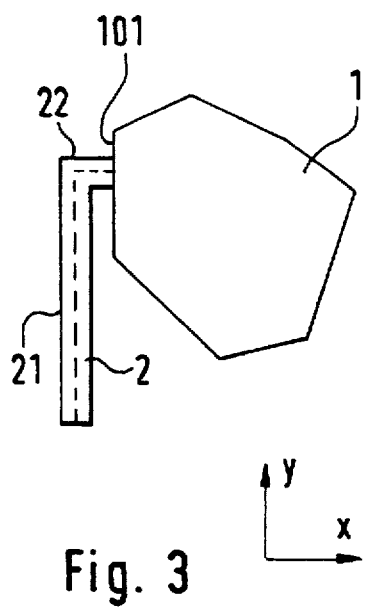
FIG. 3 illustrates a second erroneous arrangement for linking a printed conductor to a wire range.

FIG. 3 shows a wire range 1 having side 101. Side 101 is parallel to the y axis of the x,y coordinate system. Printed conductor 2 is connected to wire range 1 at side 101 by a segment 22 of printed conductor 2 that is parallel to the x axis. In addition, printed conductor 2 has a segment 21 that is parallel to the y axis and is a short distance from side 101 of wire range 1. The arrangement of printed conductor 2 and wire range 1 illustrated in FIG. 3 also poses a problem because the distance between segment 21 of printed conductor 2 and side 101 of wire range 1 is too small.

Figure 4:
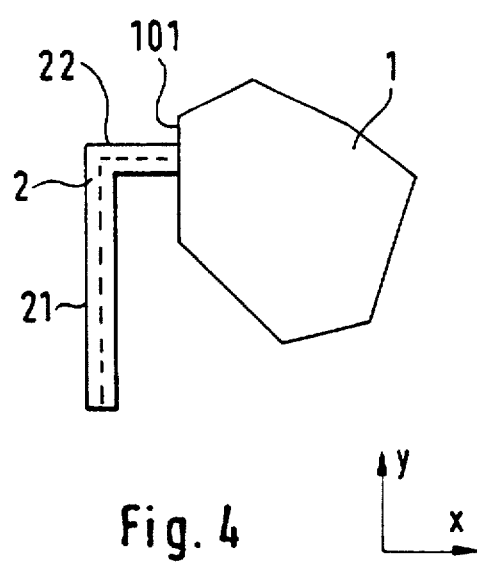
FIG. 4 shows a second proper arrangement of a printed conductor linking a wire range.

FIG. 4 also shows a wire range 1 having a side 101 parallel to the y axis. The connection is again established by a printed conductor 2 having a segment 22 parallel to the x axis and a segment 21 parallel to the y axis. In contrast with FIG. 3, however, segment 22 has a predetermined minimum length which ensures that the distance between segment 21 and side 101 will be large enough.

Various conditions must thus be met when connecting a wire range by means of a printed conductor. With regard to the wire range, the sides of the polygon that are parallel to the coordinate system or form an angle of 45° with it must be determined. Then the connection can be established to these sides by a printed conductor that is parallel or diagonal to the coordinate system. Furthermore, the corner points of the polygon that can be connected by a printed conductor must be determined. Not all the corner points can be connected.

Figures 5, 6:
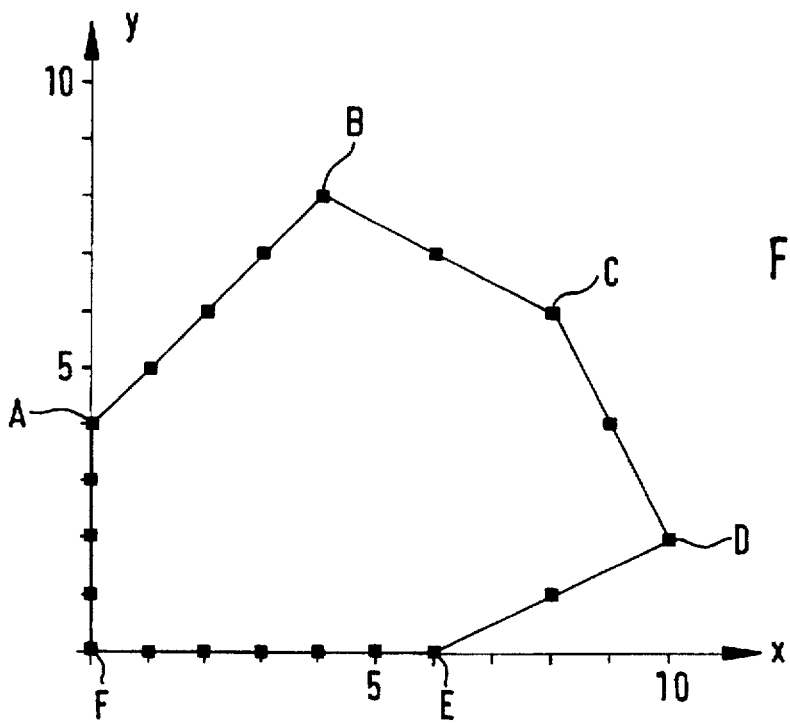
FIG. 5 shows a coordinate system with a wire range positioned in it.
FIG. 6 illustrates how the connectable edge points are determined on the basis of the example shown in FIG. 5.

FIG. 5 and the table in FIG. 6 will now be used to explain how to determine which sides and corner points of the polygon are connectable.

FIG. 5 shows an x,y coordinate system with a polygon drawn in it. The polygon includes a series of edge points each having one coordinate in the x direction and another in the y direction. Edge points A through F, i.e., the corner points where the different sides of the polygon meet, are especially important. In addition to the coordinates of each edge point, information regarding whether each edge point can be connected in parallel or can be connected diagonally or cannot be connected is stored. Only parallel printed conductors may be provided at edge points that may be connected in parallel, only diagonal printed conductors may be provided at points that can be connected diagonally and no printed conductors may be provided at edge points that are not connectable. The respective status is stored for each edge point of the polygon in FIG. 5.

FIG. 6 illustrates how the connectable edge points can be determined by considering the coordinates of the edge points. It is sufficient here to consider corner points A through F. The coordinates of the edge points between the corner points can be obtained from the diagram in FIG. 5. The x coordinates for corner points A through F are given in one column, and the y coordinates are given in a second column. In addition, a third column shows the sum of the coordinates, i.e., x+y, and yet another column shows the difference obtained by subtracting the coordinates, i.e., x−y.

First, the x and y coordinates are examined separately to determine whether there are similar successive coordinates. Corner point B follows corner point A; corner point C follows corner point B, etc. Corner point F is followed by corner point A, because a polygon is a closed series of lines. As this shows, the successive corner points A and F have the same value of zero for the x coordinate. This means that the edge points between corner points A and F lie on a straight line parallel to the y axis. Similarly, one can see that the edge points between corner points E and F lie on a straight line parallel to the x axis.

These sides of the polygon can thus be connected with parallel printed conductors. However, it is necessary to ensure here that printed conductors 2 end completely at the sides of the polygon. For example, if corner point F were connected with a parallel printed conductor with path 3 (which lies along the center line of the printed conductor) terminating at corner point F, half of the width of the printed conductor would not be contacting the wire range. To eliminate this possibility, some edge points—starting from the corner points—are assigned a "not connectable" status.

If the width of the printer conductor corresponded to the distance of four edge points, for example, the two outer edge points would have to be assigned a "not connectable" status. Five other edge points are provided between corner points E and F. Thus a "not connectable" status would be assigned to corner points E and F and to edge points having x,y coordinates of 1,0 and 5,0, and a status of "connectable at right angles" would be assigned to edge points with x,y coordinates of 2,0 and 3,0. Only the point with x,y coordinates of 0,2 between corner points A and F would be assigned a status of "connectable at right angles."

Furthermore, the maximums and minimums of the x and y coordinates may also be considered. These are corner points that can be connected at right angles. Point D has a maximum value of 10 in its x coordinate and can thus be connected by a printed conductor parallel to the x axis. Point B has a maximum y value of 8 and can be connected by a printed conductor parallel to the y axis. Points A, E and F each have minimum x and y values and therefore can also be connected in parallel. Since side walls that can be connected in parallel and whose corner points are formed by A, F and E were already recognized, it is not necessary to change the status of these corner points from "not connectable" to "connectable in parallel."

The addition table (x+y) and the subtraction table (x−y) are used to determine the diagonally connectable edge points. Corner points A and B have the same numerical value in the subtraction table. The edge points located between corner points A and B thus lie on a straight line forming an angle of 45° with the coordinate system. These edge points can thus be contacted by diagonal printed conductors. Again, the status "not connectable" is assigned to corner points A and B and the edge points with the coordinates 1,5 and 3,7, and the status "diagonally connectable" is assigned to the coordinate point 2,6. Point C has a maximum value in the addition table and point F has a minimum value. These two corner points can be contacted by diagonal printed conductors. In addition, corner point D, which has a maximum value in the subtraction table, may be contacted by a diagonal conductor. Thus, the status "diagonally connectable" is also assigned to these points. The status "not connectable" is assigned to all other edge points.

The process described here for determining the possible connections for edge points is especially suitable for automatic processing by computer. Thus, it is always simple to achieve an advantageous arrangement of the printed conductors on the surface of a semiconductor component.

Furthermore, information regarding whether each connectable edge point is a corner point or an edge point forming a side of the polygon is also stored. With the corner points, the printed conductor must be extended into the interior of wire range 1 to ensure that current will not flow through a constricted area. This is illustrated, for example, in FIG. 2, where diagonal end segment 23 of printed conductor 2 is extended into the interior of wire range 1. With all edge points, the printed conductor must be extended toward the outside, as indicated by the extended end segment 23 of printed conductor 2 in FIG. 2 and by the extended end segment 22 of printed conductor 2 in FIG. 4.

What is claimed is:

1. A process for arranging at least one printed conductor on a surface of a semiconductor component in a rectangular coordinate system having two coordinate axes, the surface of the semiconductor component supporting a plurality of wire ranges each wire range having the shape of a polygon, the polygon having a plurality of sides the sides including a plurality of edge points, the process comprising the steps of:

assigning, to at least one edge point of the plurality of edge points, a status selected from the group including "connectable in parallel", "diagonally connectable" and "not connectable";

connecting the at least one printed conductor to the at least one edge point so that the at least one printed conductor is arranged approximately parallel to one of the coordinate axes, only if the status of the at least one edge point is "connectable in parallel"; and connecting the at least one printed conductor to the at least one edge point so that the at least one printed conductor is arranged at an angle of approximately 45° relative to one of the coordinate axes, only if the status of the at least one edge point is "diagonally connectable";

wherein, when the status of the at least one edge point is "not connectable", the at least one printed conductor is not connected to the at least one edge point.

2. The process according to claim 1, wherein each one of the plurality of edge points has first and second coordinates in the rectangular coordinate system.

3. The process according to claim 2, further comprising the steps of:

determining whether each one of the plurality of edge points is connectable in parallel by considering separately for the first and second coordinates, the coordinates of a sequence of edge points;

assigning a first edge point the "connectable in parallel" status based on a determination as to whether successive edge points of the sequence of edge points have the same value for one of the first and second coordinates, wherein a number of edge points of the sequence of edge points are assigned the "not connectable" status and a remaining number of edge points of the sequence of edge points are assigned the "connectable in parallel" status;

determining at least one largest coordinate edge point and at least one smallest coordinate edge point; and assigning the "connectable in parallel" status to at least one second edge point selected from the at least one largest coordinate edge point and the at least one smallest coordinate edge point to which the "not connectable" status has not previously been assigned.

4. The process according to claim 3, wherein, when the at least one printed conductor is to be arranged at the first edge point assigned the "connectable in parallel" status, the at least one printed conductor has a minimum length in a direction leading outside the polygon.

5. The process according to claim 3, wherein, when the at least one printed conductor is to be arranged at the second edge point assigned the "connectable in parallel" status, the at least one printed conductor has a minimum length in a direction leading inside the polygon.

6. The process according to claim 2, further comprising the steps of:

forming an addition table by adding the first and second coordinates for each of a plurality of the edge points;

forming a subtraction table by subtracting the second coordinate from the first coordinate for each of a plurality of the edge points;

assigning to at least one first diagonally connectable edge point the "diagonally connectable" status by determining whether the coordinates of successive ones of the plurality of the edge points in the subtraction table has a same value for one of the first and second coordinates, wherein a number of edge points of the sequence of edge points are assigned the "not connectable" status;

determining at least one largest value edge point by selecting from the addition and subtraction tables at least one edge point having a largest value of one of the first and second coordinates;

determining at least one smallest value edge point by selecting from the addition and subtraction tables at least one edge point having a smallest value of one of the first and second coordinates;

assigning the diagonally connectable status to at least one second diagonally connectable edge point selected from the at least one largest value edge point and the at least one smallest value edge point to which the "not connectable" status has not previously been assigned.

7. The process according to claim 6, wherein, when the at least one printed conductor is to be arranged at the at least one first diagonally connectable edge point, the at least one printed conductor has a preselected minimum length in a direction leading outside the polygon.

8. The process according to claim 6, wherein, when the at least on printed conductor is to be arranged at the second diagonally connectable edge point, the at least one printed conductor has a preselected minimum length in a direction leading inside the polygon.

\* \* \* \* \*

UNITED STATES PATENT AND TRADEMARK OFFICE
CERTIFICATE OF CORRECTION

PATENT NO. : 5,736,426

DATED : April 7, 1998

INVENTOR(S) : Carsten Roedel, Juergen Scheible

It is certified that error appears in the above-identified patent and that said Letters Patent is hereby corrected as shown below:

Column 2, line 40, change ">90°" to -- <90°--.

Signed and Sealed this

Tenth Day of November 1998

Attest:

BRUCE LEHMAN

Attesting Officer

Commissioner of Patents and Trademarks